(12) United States Patent
Pan et al.

(10) Patent No.: US 10,903,319 B2
(45) Date of Patent: Jan. 26, 2021

(54) PATTERNING GRAPHENE WITH A HARD MASK COATING

(71) Applicant: Nanomedical Diagnostics, Inc., San Diego, CA (US)

(72) Inventors: Deng Pan, San Diego, CA (US); Brett Goldsmith, San Diego, CA (US)

(73) Assignee: Nanomedical Diagnostics, Inc., San Diego, CA (US)

( * ) Notice: Subject to any disclaimer, the term of this patent is extended or adjusted under 35 U.S.C. 154(b) by 0 days.

(21) Appl. No.: 15/623,279

(22) Filed: Jun. 14, 2017

(65) Prior Publication Data
US 2017/0365562 A1 Dec. 21, 2017

Related U.S. Application Data

(60) Provisional application No. 62/350,629, filed on Jun. 15, 2016.

(51) Int. Cl.
*H01L 29/16* (2006.01)
*H01L 21/02* (2006.01)
*H01L 21/027* (2006.01)
*H01L 21/311* (2006.01)

(52) U.S. Cl.
CPC ...... *H01L 29/1606* (2013.01); *H01L 21/0274* (2013.01); *H01L 21/02115* (2013.01); *H01L 21/31116* (2013.01); *H01L 21/31144* (2013.01)

(58) Field of Classification Search
CPC ........... H01L 21/02225; H01L 21/0405; H01L 21/62; H01L 21/64; H01L 21/702; H01L 29/66007; H01L 29/68
See application file for complete search history.

(56) References Cited

U.S. PATENT DOCUMENTS

| 2,724,392 A | 11/1955 | Cooper |
| 3,951,681 A | 4/1976 | Shoemaker |
| 9,349,825 B2 | 5/2016 | Feng et al. |
| 2002/0115025 A1* | 8/2002 | Noda ............... G03F 7/42 430/329 |
| 2006/0192811 A1 | 8/2006 | Silverbrook |
| 2007/0177788 A1 | 8/2007 | Liu |

(Continued)

FOREIGN PATENT DOCUMENTS

| EP | 3472619 A1 | 4/2016 |
| EP | 3472855 A1 | 4/2019 |
| WO | 2015004274 A1 | 1/2015 |

OTHER PUBLICATIONS

Patent Cooperation Treaty, International Search Report for PCT/US2017/037764, dated Sep. 6, 2017, pp. 1-2.

(Continued)

*Primary Examiner* — Cheung Lee
(74) *Attorney, Agent, or Firm* — Kunzler Bean & Adamson

(57) ABSTRACT

Embodiments of the disclosed technology include patterning a graphene sheet for biosensor and electronic applications using lithographic patterning techniques. More specifically, the present disclosure is directed towards the method of patterning a graphene sheet with a hard mask metal layer. The hard mask metal layer may include an inert metal, which may protect the graphene sheet from being contaminated or damaged during the patterning process.

19 Claims, 2 Drawing Sheets

(56) References Cited

U.S. PATENT DOCUMENTS

| | | | |
|---|---|---|---|
| 2008/0251862 A1* | 10/2008 | Fonash | B82Y 10/00 257/408 |
| 2012/0073976 A1 | 3/2012 | Chen | |
| 2012/0285527 A1 | 11/2012 | Goldblatt | |
| 2012/0295018 A1 | 11/2012 | Noguchi | |
| 2013/0099195 A1 | 4/2013 | Seacrist | |
| 2013/0182373 A1 | 7/2013 | Yu | |
| 2013/0217215 A1 | 8/2013 | Ward et al. | |
| 2014/0162433 A1 | 6/2014 | Willner | |
| 2014/0238873 A1 | 8/2014 | Li et al. | |
| 2014/0332141 A1 | 11/2014 | Willner | |
| 2015/0038378 A1 | 2/2015 | Cheng et al. | |
| 2015/0303059 A1 | 10/2015 | Friedman et al. | |
| 2015/0357596 A1 | 12/2015 | Loebl | |
| 2015/0364567 A1* | 12/2015 | Feng | H01L 29/42364 438/151 |
| 2015/0371848 A1 | 12/2015 | Zaretski | |
| 2016/0033448 A1 | 2/2016 | Milgrew | |
| 2016/0159064 A1 | 6/2016 | Pizzochhero et al. | |
| 2016/0276588 A1 | 9/2016 | Tour | |

OTHER PUBLICATIONS

Corning Museum of Glass, "What is Glass?" Dec. 2, 2011, p. 1, retreived from <http://www.cmog.org/article/what-is-glass> on Nov. 22, 2017.

Jackson, Ronald S., "Wine Tasting: A Professional Handbook," Feb. 1, 2002, retreived from <https://books.google.com/booksid=nOz8XCvAS9EC&pg=PA191> on Nov. 22, 2017.

Desai, S. et al., Gold Mediated Exfoliation of Ultralarge Optoelectronically-Perfect Monolayers, Adv. Mater. Mar. 23, 25, 2016, pp. 4053-4058.

Microchemicals, Photoresist Removal, Nov. 7, 2013, p. 1, retrieved from <https://microchemicals.com/technical_information/photoresist_removal.pdf> on Mar. 27, 2019.

Song et al., "Corrosion Protection of Electrically Conductive Surfaces," Metals, 2012, vol. 2, pp. 450-477.

Chen, E. "III. Wet and Dry Etching," Apr. 12, 2004, pp. 1-18; retreived from <https://www.mrsec.harvard.edu/education/ap298r2004/Erli%20chen%20Fabrication%20III%20-%20Etching.pdf> on Aug. 14, 2017.

Samaterials, Advantages and Disadvantages of Graphene, Mar. 27, 2014, p. 1-18, retrieved from <https://samaterials.wordpress.com/2014/03/27/advantages-and-disadvantages-of-graphene> on Mar. 27, 2019.

International Search Report and Written Opinion in International Application No. PCT/US2017/0337701, dated Sep. 6, 2017.

International Preliminary Report on Patentability in International Application No. PCT/US2017/037701, dated Dec. 18, 2018.

International Search Report and Written Opinion in International Application No. PCT/US2014/037704, dated Sep. 6, 2017.

International Preliminary Report on Patentability in International Application No. PCT/US2014/037704, dated Dec. 18, 2018.

International Preliminary Report on Patentability in International Application No. PCT/US2014/037764, dated Dec. 18, 2018.

International Search Report and Written Opinion in International Application No. PCT/US2017/033769, dated Sep. 6, 2017.

International Preliminary Report on Patentability in International Application No. PCT/US2014/037769, dated Dec. 18, 2018.

European Search Report in EP 17814101 dated Jan. 14, 2020.

European Search Report in EP 17814130 dated Jan. 10, 2020.

\* cited by examiner

PATTERNING GRAPHENE WITH A HARD MASK COATING

CROSS-REFERENCE TO RELATED APPLICATIONS

This application claims the benefit of priority to U.S. Provisional Patent Application with Ser. No. 62/350,629 filed on Jun. 15, 2016, the contents of which are incorporated herein by its entirety.

TECHNICAL FIELD

The disclosed technology relates generally to depositing a hard mask coating onto a surface of a graphene sheet. More specifically, the present invention relates to depositing a hard mask coating onto a surface of a graphene sheet to provide a protective layer.

BACKGROUND

Graphene is composed of a single thin layer of carbon atoms that are bonded together in a repeating pattern of hexagons. Graphene has many extraordinary properties, which includes high mechanical strength, high electron mobility, and superior thermal conductivity. Because graphene is a great thermal and electrical conductor, graphene material is often used to construct graphene based biosensors, transistors, integrated circuited, and other electronic applications.

While there has been much academic interest in the application and utilization of graphene, attempts to commercialize graphene based electronic devices and sensors have largely failed. As such, much of the currently known techniques for handling and preparing graphene are limited to techniques that are only suitable for research and academic purposes, and thus fail to take into consideration manufacturing costs, product assembly requirements, and the need for long-term durability.

More specifically, current methods for preparing and handling graphene often leave the graphene sheet exposed to the environment conditions when constructing the graphene based devices. Because the graphene sheets are left exposed without a protective layer, the graphene is often contaminated and even damaged, especially when exposed to the air for periods of time. Additionally, the exposed graphene surface may further be susceptible to damage during the processing, constructing, and packaging of the graphene based electronic devices and sensors.

While some limited methods for providing a protective layer on the surface of graphene sheets are currently available, such methods may still damage the graphene. For example, one method may include depositing the surface of the graphene sheet directly with a photoresist or polymethylmethacrylate (hereinafter "PMMC") layer. However, such direct contact with the graphene sheet often leaves a residue on the graphene that cannot be completely removed, even with the application of acetone or other solvents. As such, any remaining photoresist or PMMC residue on the surface of the graphene significantly lowers the quality of the graphene and is further likely to degrade the overall performance of the graphene based electronic devices and sensors.

Other methods may also include providing a protective copper layer on the surface of the graphene sheet. However, copper is also known to leave a contaminating residue on the graphene sheet that is difficult to completely remove, which also lowers the quality of the graphene and further likely to degrade the performance of the graphene based electronic devices and sensors. As such, there currently is a need to provide a way for providing a temporary protective layer on a graphene sheet.

BRIEF DESCRIPTION OF THE DRAWINGS

The technology disclosed herein, in accordance with one or more various embodiments, is described in detail with reference to the following figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

FIG. 1 illustrates the different progressions of depositing a temporary protective layer onto a surface of a graphene sheet according to one embodiment.

FIG. 2 illustrates the different progressions of patterning a graphene sheet with a hard mask layer according to one embodiment.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION OF THE EMBODIMENTS

The following description is not to be taken in a limiting sense, but is made merely for the purpose of describing the general principles of the disclosed embodiments. The present embodiments address the problems described in the background while also addressing other additional problems as will be seen from the following detailed description. Numerous specific details are set forth to provide a full understanding of various aspects of the subject disclosure. It will be apparent, however, to one ordinarily skilled in the art that various aspects of the subject disclosure may be practiced without some of these specific details. In other instances, well-known structures and techniques have not been shown in detail to avoid unnecessarily obscuring the subject disclosure.

Some embodiments disclosed herein include depositing a temporary protective layer onto a surface of a graphene sheet. It should be noted that depositing layers onto the graphene sheet may include a wide range of techniques as appreciated by one of ordinary skill in the art, such as coating techniques, focused ion beam, filament evaporation, sputter deposition, and electrolysis by way of example only.

This temporary protective layer may protect the graphene from the environment and prevent the contamination of the graphene sheet. By way of example only, the temporary protective layer may include a thin metal layer to protect the graphene from contamination or harm during the packaging and assembly of the graphene based device. The thin metal used to coat the graphene sheet may include gold, by way of example only. Because gold is an inert metal that has the characteristic property of being resistant to corrosion and oxidation, depositing the graphene sheet with a gold layer may protect the graphene. Additionally, due to gold's characteristically inert qualities, the temporary gold layer on the surface of the graphene sheet may further provide thermal protection and prevent oxidation, especially when the graphene is exposed to high temperature treatments during epoxy curing, oven baking, and burn testing. Furthermore, the temporary gold coating may also protect the graphene from potentially being contaminated during wire bonding, encapsulation, wafer dicing, and cleaning. Thus, this allows the graphene to be handled in a factory setting for large manufacturing production.

However, other inert metals may also be used to temporarily coat the graphene sheet, which may include, but are not limited to, ruthenium, rhodium, palladium, silver, osmium, iridium, platinum, and the like.

Figure 1A:
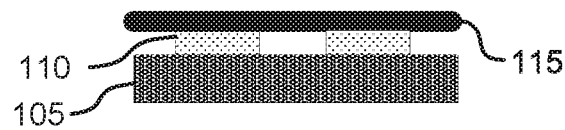
FIG. 1A illustrates a graphene sheet transferred onto a substrate according to one embodiment.

FIG. 1A illustrates a graphene sheet 115 transferred onto a substrate, such as a wafer 105, according to one embodiment. The graphene sheet 115 may be grown using chemical vapor deposition, especially when producing large sheets of graphene. However, other methods of growing the graphene layer may also include, but are not limited to, reducing oxidized graphite on a selected substrate or via mechanical exfoliation techniques.

The graphene sheet 115 may then be transferred onto another surface, such as the surface of an electronic chip or sensor. More specifically, the surface of the electronic chip or sensor may include the surface of a thin semi-conductor material, such as a wafer 105. The wafer 105 may serve as a foundation upon which the proper electronic integrated circuits can be applied. By way of example, the wafer 105 may be a silicon substrate or a silicon dioxide substrate. Additionally, the wafer 105 may be coated with platinum 110, whereby the platinum 110 acts as the bottom electrode to create the proper electrical connections.

Figure 1B:
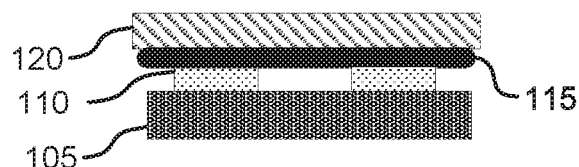
FIG. 1B illustrates a graphene sheet with a temporary metal layer according to one embodiment.

Next, the graphene sheet 115 may be treated with a temporary thin metal layer, such as a metal layer 120, as illustrated in FIG. 1B. The metal layer 120 may act as a mask or protective barrier configured to protect the graphene from being contaminated or degraded during the preparation of the graphene. To properly coat the graphene sheet 115 with the metal layer 120, the wafer 105 with the graphene sheet 115 may be placed in an electron beam evaporation chamber. Electron beam evaporation is a physical vapor disposition technique whereby an intense electron beam is generated from a filament and steered via electric and magnetic fields to strike source material, such as gold pellets, and to vaporize it within a vacuum environment. As such, by using the electron beam evaporation technique, a thin metal layer 120 may be slowly deposited onto the graphene sheet 115.

By way of example only, the metal layer 120 may include a gold metal layer. However, it should be noted that the metal layer 120 may include any inert metal that does not negatively react with graphene. Additionally, the metal layer 120 may be any inert metal that has the characteristic property of being resistant to corrosion and oxidation. By way of example only, such inert metals may include, but are not limited to, ruthenium, rhodium, palladium, silver, osmium, iridium, platinum, and the like.

The temporary gold metal layer 120 may range in a thickness from 10 nanometers to 1 micrometer. By way of another example, the gold metal layer 120 may be applied onto the graphene sheet 115 by dipping the graphene sheet 115 into a gold plating solution. Additionally, other methods of depositing a temporary metal layer may be provided. For example, other methods may also include utilizing a focused ion beam, filament evaporation, sputter deposition, electrolysis, and the like to provide a temporary gold metal layer 120 on the surface of a graphene sheet 115.

Once the metal layer 120 is deposited on top of the graphene sheet 115, metal leads or connections may be established. Furthermore, additional processes or constructions may be made on top of the gold metal layer 120 that are now layered on the surface of the graphene sheet 115. Again, due to inert nature of the metal layer 120, the metal layer 120 may help protect the graphene from being contaminated or degraded, even as the graphene is being prepped and assembled for use within select graphene based devices.

Figure 1C:
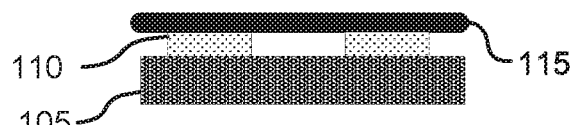
FIG. 1C illustrates a graphene sheet with a temporary metal layer removed from a surface of the graphene sheet according to one embodiment.

Once the preparation of the graphene completed, the metal layer 120 may now be removed, as illustrated in FIG. 1C. For example, the metal layer 120 may be washed with potassium iodide solution for a duration ranging from 30 seconds to 5 minutes, or for a time period where all trace of the metal layer 120 is removed from the surface of the graphene sheet 115. The now fully exposed graphene sheet 115 may then be washed with deionized water to remove any remaining metal layer particles or other materials left on the surface of the graphene sheet 115. The now exposed graphene sheet 115 may further be available for any additional processes required to further manufacture and assemble a proper and functional graphene based device.

In other embodiments, a metal layer placed on top of a graphene sheet may include additional coatings or layers that are deposited on top of the metal layer, as illustrated in FIG. 2. More specifically, FIG. 2A illustrates a graphene sheet 215 transferred onto a substrate according to one embodiment. Next, the graphene sheet 215 may be treated with a thin metal layer, such as a gold metal layer 220, as illustrated in FIG. 2B. The gold metal layer 220 may act as a mask or barrier configured to protect the graphene from being contaminated or degraded. As discussed above, the thin metal layer may be any inert metal inert metal that has the characteristic property of being resistant to corrosion and oxidation, such that depositing the graphene sheet with a gold layer protects the graphene from being contaminated or degraded. As such, the thin metal layer may include any of the following inert metals or combination thereof: ruthenium, rhodium, palladium, silver, osmium, iridium, platinum, and the like.

Figure 2A:
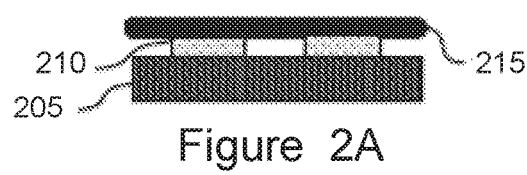
FIG. 2A illustrates a graphene sheet transferred onto a substrate according to one embodiment.
Figure 2B:
FIG. 2B illustrates a graphene sheet with a metal layer according to one embodiment.
Figure 2C:
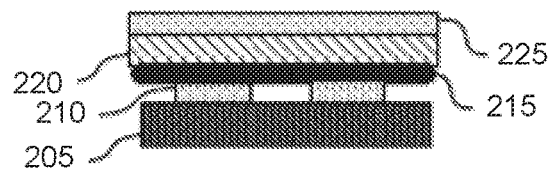
FIG. 2C illustrates a graphene sheet with a metal layer and a photoresist layer for lithographic patterning according to one embodiment.

The graphene sheet 215 with the gold metal layer 220 may additionally be coated with a photoresist layer 225, as further illustrated in FIG. 2C. The photoresist layer 225 may include photosensitive material that experiences a change in its physical properties when exposed to a radiation source. By selectively exposing the photoresist layer 225 with radiation, such exposed areas of the photoresist layer 225 may be etched away, thus exposing portions of the metal gold layer 220 directly underneath the photoresist layer 225. In other words, the photoresist layer 225 may act as a template for accurately patterning the graphene sheet 215 underneath the photoresist layer 225. Thus the pattern etched onto the photoresist layer 225 via the radiation source may be used as a template to etch the same pattern onto the graphene sheet 215 directly below the photoresist layer 225.

Figure 2D:
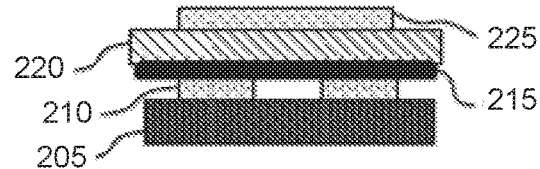
FIG. 2D illustrates a graphene sheet with a metal layer and a photoresist layer exposed to a radiation source to create a pattern template according to one embodiment.

As further illustrated in FIG. 2D, once the photoresist layer 225 is exposed with a radiation source with a particular pattern etched onto the photoresist layer 225, the etched away portions of the photoresist layer 225 expose portions of gold metal layer 220 directly below.

Figure 2E:
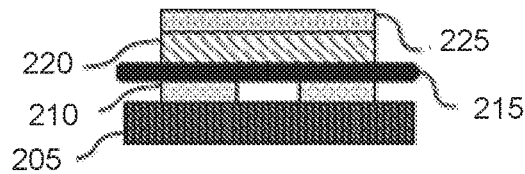
FIG. 2E illustrates a graphene sheet with a metal layer and a photoresist layer exposed to a metal etchant solution to pattern the metal layer according to one embodiment.

To pattern the graphene sheet 215 underneath the gold metal layer 220, the gold metal layer 220 must also be etched away in accordance to the pattern etched onto the photoresist layer 225, as further illustrated in FIG. 2E. To do so, for example, the wafer 205 may be submerged in an etchant solution that etches away only the exposed gold metal layer 220 not covered with the photoresist layer 225. For example, the etchant solution may be a potassium iodide solution. However, it should be noted that the etchant solution need not be limited to a potassium iodide solution, but instead, may also include a cyanide based chemical or an aqua regia with a mixture of nitric and hydrochloric acids. Because the etchant solution only reacts with the gold and not the photoresist layer 225, only the exposed gold metal layer 220 is removed and thus forms a negative space pattern in accordance to the pattern etched onto the photoresist layer 225.

Figure 2F:
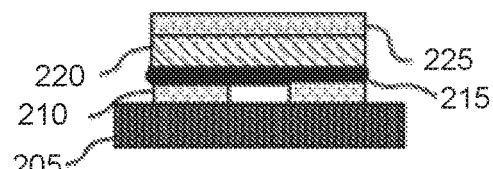
FIG. 2F illustrates a graphene sheet with a metal layer and a photoresist layer exposed to a plasma etchant solution to pattern the graphene sheet according to one embodiment.

With the photoresist layer 225 and the gold metal layer 220 now etched away in accordance to the etched template from the photoresist layer 225, the graphene sheet 215 is now exposed, as further illustrated in FIG. 2E. As such, the graphene sheet 215 may now be patterned accordingly to the specific pattern that etched away specific portions of the photoresist layer 225. For example, the wafer 205 with the graphene sheet 215 may undergo plasma etching, which only removes the exposed graphene sheet 215 in areas where the gold metal layer 125 was removed from the etchant solution, as illustrated in FIG. 2F. As such, the graphene sheet 215 is now patterned accordingly.

Figure 2G:
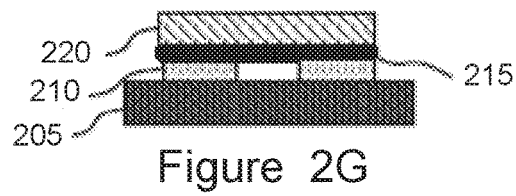
FIG. 2G illustrates a patterned graphene sheet with a metal layer according to one embodiment.

Upon proper patterning of the graphene sheet 215 via plasma etching, the photoresist layer 225 may now be removed, as further illustrated in FIG. 2G. For example, the wafer 205 with the photoresist layer 225 may be rinsed with acetone for 2 to 10 minutes followed by isopropanol alcohol for another 1 to 5 minutes, which will effectively and have completely dissolved the photoresist layer 225. This now completely exposes the remaining gold metal layer 220 on the wafer 205. However, it should be noted that other solvents may also be used, such as acetone, methyl isopropyl ketone and the like.

Additionally, the wafer 205 may be coated with platinum 210, whereby the platinum 210 acts as the bottom electrode to create the proper electrical connections.

Figure 2H:
FIG. 2H illustrates a patterned graphene sheet according to one embodiment

Next, the gold metal layer may now be removed, as illustrated in FIG. 2H. For example, the gold metal layer 220 may be washed with potassium iodide solution for 30 seconds to 5 minutes such that the thin metal gold layer 220 is no longer coated on the surface of the graphene sheet 215. The exposed graphene sheet 215 may then be washed with deionized water to remove any remaining gold particles or other materials on the surface of the graphene sheet 215. The now exposed patterned graphene sheet 215 is available for any further additional processing or preparation.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

The invention claimed is:

1. A method for patterning a graphene-based device in graphene, the method comprising:
    placing a graphene sheet on a wafer;
    depositing a temporary protective metal layer on the graphene sheet;
    depositing a photoresist layer on the temporary protective metal layer;
    exposing the photoresist layer to a radiation source in accordance with a pattern, the pattern comprising etching areas and mask areas, wherein the mask areas are configured to protect masked portions of the graphene sheet from contamination during packaging process of the graphene-based device, and wherein the etching areas are configured to expose portions of the temporary protective metal layer, and the graphene sheet;
    etching away the etching areas of the temporary protective metal layer, and the graphene sheet;
    packaging the graphene-based device, wherein the packaging comprises epoxy curing, or encapsulating the graphene-based device; and
    after the packaging, removing the masked portions of the temporary protective metal layer that protected the masked portions of the graphene sheet during packaging.

2. The method of claim 1, further comprising removing a masked portion of the photoresist layer as a process step that directly precedes a next process step, the next process step being the removing the masked portions of the temporary protective metal layer that protected the masked portions of the graphene sheet during packaging.

3. The method of claim 1, wherein removing the masked portions of the temporary protective metal layer comprises washing the masked portions of the temporary protective metal layer with a potassium iodide solution.

4. The method of claim 3, further comprising removing a portion of the graphene sheet previously covered by the portion of the temporary protective metal layer.

5. The method of claim 4, wherein the removing the portion of the graphene sheet comprises applying a plasma etching process to the portion of the graphene sheet.

6. The method of claim 1, wherein the removing the masked portions of the temporary protective metal layer comprises washing the temporary protective metal layer with a potassium iodide solution.

7. A method for patterning graphene comprising:
    placing a graphene sheet on a wafer;
    depositing a temporary protective metal layer on the graphene sheet, wherein the temporary protective metal layer protects a patterned graphene portion of the graphene sheet from contamination or harm during packaging and assembly of a graphene-based device comprising the patterned graphene portion;
    depositing a photoresist layer on the temporary protective metal layer;
    exposing portions of the photoresist layer to a radiation source in accordance with a pattern comprising etching areas and mask areas;
    etching away the exposed portions of the photoresist layer to expose portions of the temporary protective metal layer within the etching areas the pattern;
    etching away the exposed portions of the temporary protective metal layer to expose portions of the graphene sheet within the etching areas of the pattern;
    patterning portions of the graphene sheet by etching away the exposed portions of the graphene sheets at areas within the etching areas of the pattern;
    packaging and assembling the graphene-based device while portions of the temporary protective metal layer within the mask areas of the pattern remain during the packaging and assembly to protect the patterned graphene portion of the graphene-based device;
    after the packaging and assembling of the graphene-based device, exposing the mask areas of the patterned graphene portion of the graphene-based device for use in a biosensor application, wherein exposing the mask areas of the patterned graphene portion comprises
    removing the portions of the temporary protective metal layer within the mask areas that protected the patterned graphene portion during the packaging and assembly.

8. The method of claim 7, wherein protecting the mask areas corresponding to the patterned graphene portion from contamination comprises protecting the patterned graphene portion from exposure to air or photoresist residue.

9. The method of claim 7, wherein protecting the mask areas corresponding to the patterned graphene portion from contamination comprises using the temporary protective metal layer to provide thermal protection that protects the patterned graphene portion from exposure to high temperature treatments during one or more packaging and assembly processes.

10. The method of claim 7, wherein the temporary protective metal layer is selected from gold, ruthenium, rhodium, palladium, silver, osmium, iridium, and platinum.

11. The method of claim 7, wherein depositing the temporary protective metal layer is performed using one or more depositing techniques selected from coating techniques, focused ion beam, filament evaporation, sputter deposition, and electrolysis.

12. The method of claim 7, wherein a process step of removing the portions of the photoresist layer within the mask areas directly precedes a next process step, the next process step being the removing the portions of the temporary protective metal layer within the mask areas that protected the patterned graphene portion during the packaging and assembly.

13. The method of claim 12, wherein the process step of removing the portions of the photoresist layer is performed using one or more solvents selected from acetone, isopropanol alcohol, and methyl isopropyl ketone.

14. The method of claim 7, wherein removing the portions of the temporary protective metal layer within the mask areas after the packaging and the assembly of the graphene-based device comprises washing the temporary protective metal layer with a potassium iodide solution until the temporary protective metal layer is no longer coated on a surface of the graphene sheet.

15. The method of claim 7, further comprising washing an exposed surface of the patterned graphene portion with deionized water after the packaging and the assembly of the graphene-based device to remove any materials left on the exposed surface of the patterned graphene portion.

16. An apparatus comprising:
a graphene-based device for a biosensor application comprising a patterned graphene portion protected from contamination or damage during packaging and assembly of the graphene-based device by a temporary protective metal layer that is removed from the patterned graphene portion after the packaging and the assembly of the graphene-based device, wherein the graphene-based device is manufactured according to the following process steps:
placing a graphene sheet on a wafer;
depositing the temporary protective metal layer on the graphene sheet;
depositing a photoresist layer on the temporary protective metal layer;
exposing portions of the photoresist layer to a radiation source in accordance with a pattern comprising etching areas and mask areas;
etching away the exposed portions of the photoresist layer to expose portions of the temporary protective metal layer within the etching areas of the pattern;
etching away the exposed portions of the temporary protective metal layer to expose portions of the graphene sheet within the etching areas of the pattern;
patterning portions of the graphene sheet by etching away the exposed portions of the graphene sheet at areas within the etching areas of the pattern;
packaging and assembling the graphene-based device while portions of the temporary protective metal layer within the mask areas of the pattern remain to protect the patterned graphene portion of the graphene-based device;
after the packaging and the assembling of the graphene-based device, exposing the mask areas of the patterned graphene portion of the graphene-based device for use in the biosensor application, wherein exposing the mask areas of the patterned graphene portion comprises removing the portions of the temporary protective metal layer within the mask areas that protected the patterned graphene portion during the packaging and assembly.

17. The apparatus of claim 16, further comprising one or more bottom electrodes spaced apart and disposed directly under the patterned graphene portion, the one or more bottom electrodes comprising a platinum coating on the wafer.

18. The apparatus of claim 16, wherein the graphene-based device is manufactured according to a further process step of removing the portions of the photoresist layer within the mask areas wherein the further process step directly precedes a next process step, the next process step being the process step of removing the portions of the temporary protective metal layer within mask areas that protected the patterned graphene portion during the packaging and assembly.

19. The apparatus of claim 16, wherein removing the portions of the temporary protective metal layer within the mask areas after the packaging and the assembly of the graphene-based device comprises washing the temporary protective metal layer with a potassium iodide solution until the temporary protective metal layer is no longer coated on a surface of the graphene sheet.

\* \* \* \* \*